United States Patent
Hu et al.

(10) Patent No.: US 10,270,332 B2
(45) Date of Patent: Apr. 23, 2019

(54) OVERLOAD CURRENT LIMITING METHOD FOR VOLTAGE SOURCE CONVERTER

(71) Applicants: NR ELECTRIC CO., LTD, Nanjing (CN); NR ENGINEERING CO., LTD, Nanjing (CN)

(72) Inventors: Zhaoqing Hu, Nanjing (CN); Yunlong Dong, Nanjing (CN); Yu Lu, Nanjing (CN); Haiying Li, Nanjing (CN); Dongming Cao, Nanjing (CN)

(73) Assignees: NR ELECTRIC CO., LTD, Nanjing (CN); NR ENGINEERING CO., LTD, Nanjing (CN)

( * ) Notice: Subject to any disclaimer, the term of this patent is extended or adjusted under 35 U.S.C. 154(b) by 0 days.

(21) Appl. No.: 16/081,437

(22) PCT Filed: Apr. 6, 2017

(86) PCT No.: PCT/CN2017/079636
§ 371 (c)(1),
(2) Date: Aug. 31, 2018

(87) PCT Pub. No.: WO2017/174015
PCT Pub. Date: Oct. 12, 2017

(65) Prior Publication Data
US 2019/0081551 A1 Mar. 14, 2019

(30) Foreign Application Priority Data
Apr. 8, 2016 (CN) .......................... 2016 1 0219293

(51) Int. Cl.
*H02M 1/32* (2007.01)
*G05F 1/70* (2006.01)
(Continued)

(52) U.S. Cl.
CPC ................ *H02M 1/32* (2013.01); *G05F 1/66* (2013.01); *G05F 1/70* (2013.01); *H02H 5/041* (2013.01);
(Continued)

(58) Field of Classification Search
CPC ........... H02M 2001/0025; H02M 1/32; H02M 2001/327; H02M 5/4584;
(Continued)

(56) References Cited

U.S. PATENT DOCUMENTS

| | | | |
|---|---|---|---|
| 8,904,338 B2* | 12/2014 | Erickson | G06Q 10/0639 717/101 |
| 2013/0046663 A1* | 2/2013 | Antonesei | G01R 31/04 705/34 |

FOREIGN PATENT DOCUMENTS

| | | |
|---|---|---|
| CN | 104333032 A | 2/2015 |
| CN | 104882911 A | 9/2015 |

(Continued)

*Primary Examiner* — Timothy J. Dole
*Assistant Examiner* — Ishrat F Jamali
(74) *Attorney, Agent, or Firm* — Gokalp Bayramoglu

(57) ABSTRACT

According to the overload current limiting method for a voltage source converter, when a pole control system receives a water-cooling overload current limiting instruction, an active and reactive instruction are changed at the same time according to a specified slope, so that an absolute value of an arm current of the converter decreases in a fixed slope, and can be ensured that active power and reactive power fall to zero at the same time, and a water-cooling load limiting aim of the converter can be achieved by reducing the arm current. After a water-cooling overload power limiting instruction received by the pole control system is cancelled, a current value of the active power and the inactive power remain unchanged. When a water-cooling overload power limiting instruction is received again,
(Continued)

decrease continues on the basis of current power values until the power falls to zero.

7 Claims, 2 Drawing Sheets

(51) Int. Cl.

| | |
|---|---|
| *G05F 1/66* | (2006.01) |
| *H02J 3/36* | (2006.01) |
| *H02M 5/458* | (2006.01) |
| *H02H 5/04* | (2006.01) |
| *H02H 9/00* | (2006.01) |
| *H02H 7/12* | (2006.01) |
| *H02J 3/18* | (2006.01) |
| *G01R 21/00* | (2006.01) |
| *H02M 1/00* | (2006.01) |
| *H02M 7/483* | (2007.01) |

(52) U.S. Cl.
CPC .......... *H02H 7/1216* (2013.01); *H02H 9/001* (2013.01); *H02J 3/18* (2013.01); *H02J 3/36* (2013.01); *H02M 5/4585* (2013.01); *G01R 21/002* (2013.01); *G01R 21/003* (2013.01); *H02M 2001/0012* (2013.01); *H02M 2001/0025* (2013.01); *H02M 2001/327* (2013.01); *H02M 2007/4835* (2013.01)

(58) Field of Classification Search
CPC ......... H02M 2007/49835; H02M 2001/00012; H02J 3/18; H02H 5/041; H02H 7/1216; H02H 9/001
See application file for complete search history.

(56) References Cited

FOREIGN PATENT DOCUMENTS

| | | |
|---|---|---|
| CN | 105140948 A | 12/2015 |
| CN | 105915038 A | 8/2016 |
| JP | 2014192992 A | 10/2014 |

\* cited by examiner

OVERLOAD CURRENT LIMITING METHOD FOR VOLTAGE SOURCE CONVERTER

CROSS REFERENCE TO RELATED APPLICATIONS

This application is the national phase entry of International Application PCT/CN2017/079636, filed on Apr. 6, 2017, which is based upon and claims priority to Chinese Patent Application No. CN201610219293.1 filed on Apr. 8, 2016 the entire contents of which are incorporated herein by reference.

BACKGROUND OF THE INVENTION

Technical Field

The present invention relates to the field of direct current (DC) power transmission technology, and in particular, to an overload current limiting method for a voltage source converter.

Background

A voltage source converter is used in flexible DC power transmission, which can independently regulate active and reactive power transmission and increase the transmission capacity of an alternating current (AC) system. Such a converter makes it easy to form a multi-terminal DC power transmission system. Therefore, in the application field of power generation for renewable energy sources, power supply in isolated cities, and interconnection of AC systems, the voltage source converter has obvious competitiveness.

Currently, a modular multi-level technology is used in the topology of the voltage source converter for flexible DC power transmission. A current passes through six bridge arms of the converter in a normal operation condition, and switch-on/switch-off of a switch device of modules results in a thermal loss. Therefore, a certain water-cooling capacity is required to reduce the temperature, so as to ensure safety operation of the modules. However, an insufficient water-cooling capacity may cause excessively high temperature of water output through a valve, such that the system cannot operate safely. In this case, upon detecting the high water temperature, a water-cooling control system may send a water-cooling overload current limiting instruction to an upper host control system in advance.

Currently, after receiving the water-cooling overload current limiting instruction, the upper host may use a method of reducing the DC current, or use a dynamic current limit control manner. The former processing method is chiefly applied in a conventional DC power transmission of a Line-Commutated Converter type. The latter processing manner belongs to the range of inner-loop current limiting, and is chiefly used for transient current limiting. The both processing method have certain limitations when applied in overload current limiting for a voltage source converter, because an arm current of the voltage source converter not only includes an active component, but includes a reactive current component. Thus, after reduction of only the DC current, an objective of limiting the overload arm current cannot be completely achieved. The transient current limiting manner can rapidly give a response and is generally applied in a transient control; therefore, this manner is unable to meet the requirements for current limiting during overload. A method proposed in the present invention is applicable to overload limit for a voltage source converter with a monopolar or bipolar topology.

SUMMARY OF THE INVENTION

An objective of the present invention is to provide an overload current limiting method for a voltage source converter, which is applied to a monopolar or bipolar topology in a flexible DC power transmission system. When a pole control system receives a water-cooling overload current limiting instruction, an active and reactive instruction are changed at the same time according to a specified slope, so that an absolute value of an arm current of the converter decreases in a fixed slope, and it can be ensured that active power and reactive power fall to zero at the same time, and a water-cooling load limiting aim of the converter can be achieved by reducing the arm current, thus ensuring safe operation of the converter vale during overload.

To achieve the foregoing objective, the present invention adopts the following solutions:

When receiving a water-cooling overload current limiting instruction, an upper-layer control host changes an active instruction and a reactive instruction at the same time according to a specified slope, so that an absolute value of an arm current of the converter decreases in a fixed slope. During power reduction, the active instruction and the reactive instruction are changed according to the slope by a change method as follows:

The active instruction is changed as follows:

$$Pref = sig(P_0)|(P_0 \pm \int_0^t (RAMP\_P) dt)|$$

where $P_0$ is an output active power of the converter before water-cooling load limiting; $sig(P_0)$ indicates retrieving a plus/minus sign of the initial active power; RAMP_P is a positive value and represents a slope, which is generally set to a positive constant and used to indicate how many megawatts (MW) per minute; and whether the symbol ± represents a plus or minus sign is determined according to whether the initial active power $P_0$ is a positive or negative value, where if the initial active power $P_0 > 0$, a minus sign is represented, or if the initial active power $P_0 < 0$, a plus sign is represented; the reactive instruction is changed in a fixed slope according to a proportion of the initial active power and initial reactive power.

The reactive instruction is changed as follows:

$$Qref = Q_0 \left| \left( \frac{P_0 \pm \int_0^t (RAMP\_P) dt}{P_0} \right) \right|$$

When the active power and the reactive power of a pole limited due to overload are changed in this manner, it can be ensured that the arm current decreases according to the slope, so as to avoid overload of the voltage source converter caused by an insufficient water-cooling capacity that occurs because the arm current results in a thermal loss of the converter.

In the foregoing overload current limiting method for a voltage source converter, the change of the active instruction and the change of the reactive instruction are independent of each other, which specifically refers to that, the active power and the reactive power decrease at the same time according to the change method; or a power control station does not change the reactive instruction and changes only the active instruction, so that active power of a DC voltage control station on the other terminal can be reduced, and reactive power of the DC voltage control station is reduced according to the foregoing method.

In the foregoing overload current limiting method for a voltage source converter, if an active power control station receives the water-cooling overload current limiting instruction, the active power control station changes its own instructions according to the foregoing method for changing the active and reactive instruction; if a DC voltage control station receives the water-cooling overload current limiting instruction, the DC voltage control station sends an instruction for requesting to reduce active power to the other active power control station through inter-station communication, and changes a reactive instruction of the DC voltage control station together; and after receiving the instruction for requesting to reduce active power from the DC voltage control station, the active power control station changes the active instruction in the foregoing method, but does not change the own reactive instruction.

In the foregoing overload current limiting method for a voltage source converter, after a water-cooling overload power limiting instruction received by the upper-layer control host is cancelled, current values of the active power and the reactive power remain unchanged, a new power change slope and a new power instruction value are manually configured, and the active power or the reactive power increases/decreases to the new power instruction value according to the new change slope; and therefore, when a water-cooling overload power limiting instruction is received again, decrease continues on the basis of current power values until the power falls to zero.

In the foregoing overload current limiting method for a voltage source converter, in a bipolar topology structure, one pole, when being limited due to overload, individually changes its own active power and reactive power, and active and reactive power of the other pole are adjusted according to operation requirements, where the active power of the other pole is changed in magnitude in concert with that of the power-limited pole, or the active power is obtained by subtracting an actually measured active power value of the limited pole from a total active instruction, and above method is based on the principle that total active power of two poles remains unchanged; the reactive power is obtained by subtracting an actually measured reactive power value of the limited pole from a total reactive instruction based on the principle that total reactive power remains unchanged, as a reactive instruction for the other pole.

When the foregoing overload current limiting method for a voltage source converter is applied in the bipolar topology structure, if the bipolar topology structure operates in a metal return line mode, when one pole individually changes its own active power and reactive power since the one pole is limited due to overload, the following method is used for the other pole to keep the total active and reactive power unchanged: switching the pole limited due to overload to a monopolar power control mode, which means that, this pole individually changing its own active power and reactive instruction according to the manner described in claim 1; and the other pole remaining a control manner unchanged, that is, acquiring an actually measured active and reactive power value of the pole limited due to overload through communication, and obtaining the active and reactive instruction of the non-limited pole by subtracting the active and reactive power value of the limited pole from the total active and reactive instruction respectively.

When the foregoing overload current limiting method for a voltage source converter is applied in the bipolar topology structure, if the bipolar topology structure operates in a ground return line mode, when one pole individually changes its own active power and reactive power since the one pole is limited due to overload, the other pole tracks the limited pole and receives an actually measured active power value through inter-pole communication, and a power instruction equals the actually measured power of the other pole, such that the current of the ground return line remains equal to zero all the time; the reactive power instruction is obtained by subtracting an actually measured reactive power value of the limited pole from the total reactive instruction, as a reactive instruction of the other pole, so that the total reactive power remains unchanged.

After use of the foregoing solution, the present invention achieves the following beneficial effects:

(1) When active power and reactive power of a pole limited due to overload are changed in this manner, it can be ensured that an arm current decreases according to a specified slope, so as to avoid overload of the voltage source converter caused by an insufficient water-cooling capacity that occurs because the arm current results in a thermal loss of the converter.

(2) This method is applied to a bipolar topology structure operating in manners of a metal return line or a ground return line. When one pole is limited due to overload, the total active and reactive power remain unchanged by means of active and reactive power compensation of the other pole or by remaining a ground current operating in the manner of the ground return line equal to zero.

DETAILED DESCRIPTION OF THE INVENTION

Figure 2:
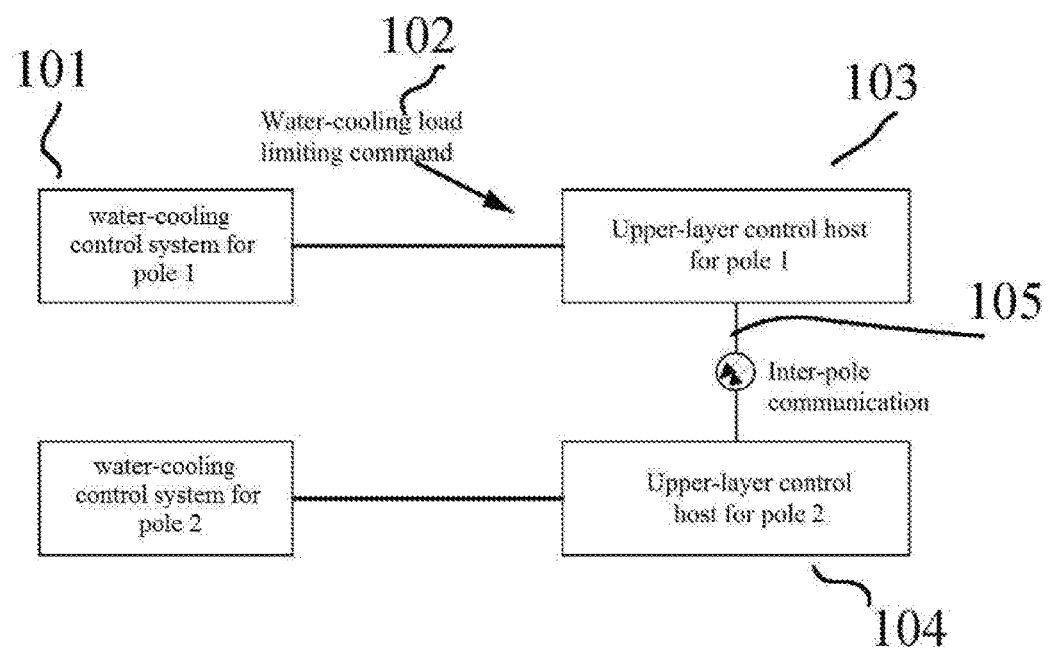
FIG. 2 is a diagram showing a relationship between maximum output active power of a converter and a network-side AC voltage according to the present invention.

An objective of the present invention provides an overload current limiting method for a voltage source converter, which is applied to a monopolar or bipolar topology in a flexible DC power transmission system. As shown in FIG. 2, upon receiving an overload current limiting instruction 102 from a water-cooling control system 101, an upper-layer control host 103 for a pole 1 changes an active and reactive instruction at the same time according to a specified slope, so that an absolute value of an arm current of the converter decreases in a fixed slope, and it can be ensured that active power and reactive power fall to zero at the same time, thus achieving a water-cooling load limiting aim of the converter by reducing the arm current. In this manner, after a water-cooling overload power limiting instruction received by the pole control system is cancelled, current values of the active power and the reactive power remain unchanged. When a water-cooling overload power limiting instruction is received again, decrease continues on the basis of current power values until the power falls to zero. According to this method, in a voltage source type monopolar or bipolar topology, a water-cooling overload power limiting function can be realized, and safe operation of a converter valve can be ensured during overload.

To achieve the foregoing objective, implementation manners of the present invention are as follows:

Upon receiving the overload current limiting instruction 102 from the water-cooling control system 101, the upper-layer control host 103 changes an active and reactive instruction at the same time according to a specified slope, so that an absolute value of an arm current of the converter decreases in a fixed slope. In a power decrease process, the active instruction and the reactive instruction are changed according to the slope by a change method as follows:

The active instruction is changed as follows:

$$Pref = sig(P_0) | (P_0 \pm \int_0^t (RAMP\_P)dt) |$$

$P_0$ is an output active power of the converter before water-cooling load limiting; $sig(P_0)$ indicates retrieving a plus/minus sign of the initial active power; RAMP_P is a positive value and represents a slope, which is generally set to a positive constant and used to indicate how many megawatts (MW) per minute; and whether the symbol ± represents a plus or minus sign is determined according to whether the initial active power $P_0$ is a positive or negative value, where if the initial active power $P_0>0$, a minus sign is represented, or if the initial active power $P_0<0$, a plus sign is represented; the reactive instruction is changed in a fixed slope according to a proportion of the initial active power to an initial reactive power.

The reactive instruction is changed as follows:

$$Qref = Q_0 \left\| \left( \frac{P_0 \pm \int_0^t (RAMP\_P)dt}{P_0} \right) \right\|$$

When the active power and the reactive power of a pole limited due to overload are changed in this manner, it can be ensured that the arm current uniformly decreases according to the slope, so as to avoid overload of the voltage source converter caused by an insufficient water-cooling capacity that occurs because the arm current results in a thermal loss of the converter.

In the foregoing overload current limiting method for a voltage source converter, the change of the active instruction and the change of the reactive instruction are independent of each other, which specifically refers to that, the active power and the reactive power decrease at the same time according to the proposed method; or a power control station does not change the reactive instruction and changes only the active instruction, so that active power of a DC voltage control station on the other terminal can be reduced, and reactive power of the DC voltage control station is reduced according to the foregoing method.

In the foregoing overload current limiting method for a voltage source converter, if an active power control station receives the water-cooling overload current limiting instruction, the active power control station changes its own instructions according to the foregoing method for changing the active and reactive instruction. If a DC voltage control station receives the water-cooling overload current limiting instruction, the DC voltage control station sends an instruction for requesting to reduce active power to a power control station through inter-station communication, and further changes a reactive instruction of the DC voltage control station. After receiving the instruction for requesting to reduce active power from the DC voltage control station, the power control station changes the active instruction in the foregoing manner, but does not change the own reactive instruction.

In the foregoing overload current limiting method for a voltage source converter, after a water-cooling overload power limiting instruction received by the upper-layer control host 103 is cancelled, current values of the active power and the reactive power remain unchanged, a new power change slope and a new power instruction value are manually configured, and the active power or the reactive power increases/decreases to the new power instruction value according to the new change slope. Therefore, when a water-cooling overload power limiting instruction is received again, decrease continues on the basis of current power values until the power falls to zero.

In the foregoing overload current limiting method for a voltage source converter, in a bipolar topology structure, the upper-layer control host 103 of one pole individually changes its own active power and reactive power since the one pole is limited due to overload, and active and reactive power of an upper-layer control host 104 of the other pole are adjusted according to requirements. The active power may be changed in magnitude in concert with the power-limited pole, or the active power of the other pole is adjusted based on the purpose of remaining total active power unchanged. The reactive power thereof is adjusted based on the purpose of remaining total reactive power unchanged.

Figure 1A:
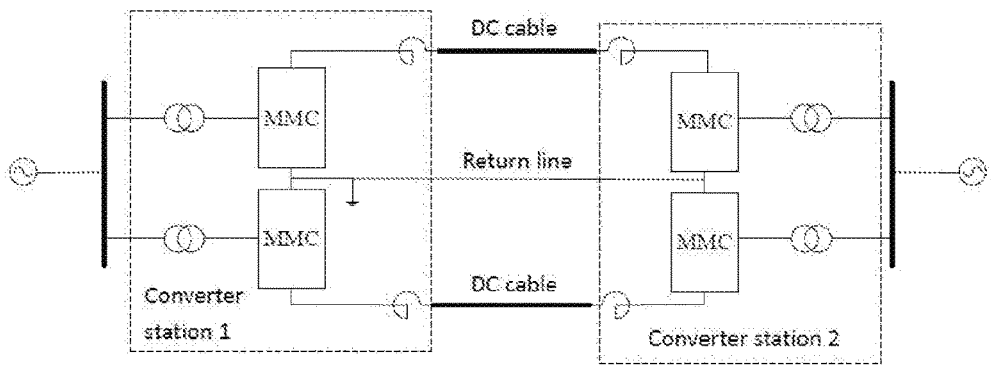
FIG. 1(a) shows a bipolar topology operating in a manner of a metal return line.

The foregoing overload current limiting method for a voltage source converter is applied in a bipolar topology structure, and the bipolar topology structure does not require bipolar balanced operation in a power decrease process. Based on such a condition, as shown in FIG. 1(a), when one pole 103 individually changes its own active power and reactive power since the one pole is limited due to overload, the following method is used for the other pole 104 to keep the total active and reactive power unchanged. The pole limited due to overload is switched to a monopolar power control mode, which means that, this pole individually changes its own active power and reactive instruction according to the manner described in claim 1, while the other pole 104 remains a control manner unchanged. That is, the other pole 104 acquires an actually measured active and reactive power value of the pole limited due to overload through communication 105, and obtains the active and reactive instruction of the non-limited pole by subtracting the active and reactive power value of the limited pole from the total active and reactive instruction respectively.

Figure 1B:
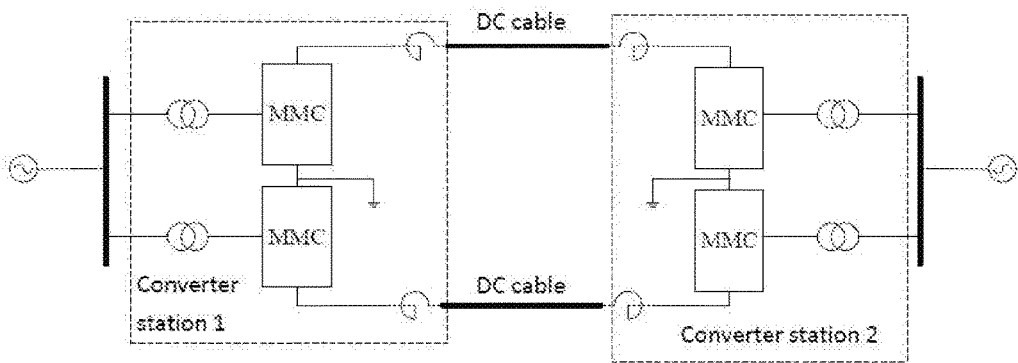
FIG. 1(b) shows a bipolar topology operating in a manner of a ground return line, where MNIC represents a modular multi-level converter.

The foregoing overload current limiting method for a voltage source converter is applied in a bipolar topology structure, and the bipolar topology structure requires bipolar balanced operation in a power decrease process. Based on such a condition, as shown in FIG. 1(b), when one pole 103 individually changes its own active power and reactive power since the one pole is limited due to overload, the other pole 104 tracks the limited pole and receives an actually measured active power value through communication 105, and a power instruction equals the actually measured power of the other pole, such that the current of a ground return line remains equal to zero all the time. For the reactive power, a reactive instruction of the other pole 104 is obtained by subtracting an actually measured reactive power value of the limited pole from the total reactive instruction, so that the total reactive power remains unchanged.

The above embodiments are merely used for explaining the technical solutions of the present invention, but are not intended to limit the present invention. Various forms of modifications or changes made with reference to the above embodiments all fall within the protection scope of the present invention.

What is claimed is:

1. An overload current limiting method for a voltage source converter, comprising:

changing an active instruction and a reactive instruction according to a specified slope by an upper-layer control host simultaneously or individually when a water-cooling overload current limiting instruction is received, so that an absolute value of an arm current of the voltage source converter decreases in a fixed slope; wherein during power reduction, the active instruction and the reactive instruction are changed according to the specified slope by the following change method:

expressing the active power instruction by the following formula:

$$Pref = sig(P_0)|(P_0 \pm \int_0^t (RAMP\_P)dt)|$$

wherein $P_0$ is an output active power of the converter before a water-cooling load limiting; $sig(P_0)$ indicates retrieving a plus/minus sign of the initial active power; RAMP_P is a positive constant which represents a slope, and indicates a power change rate; and whether the symbol ± represents a plus or minus sign is determined according to whether the initial active power $P_0$ is a positive or negative value, wherein if the initial active power $P_0>0$, a minus sign is represented, or if the initial active power $P_0<0$, a plus sign is represented; and changing the reactive instruction in magnitude in a fixed slope according to a proportion of the initial active power and an initial reactive power; wherein the reactive instruction is changed according to the following formula:

$$Qref = Q_0 \left| \left( \frac{P_0 \pm \int_0^t (RAMP\_P)dt}{P_0} \right) \right|$$

wherein $Q_0$ is an output reactive power of the converter before the water-cooling load limiting.

2. The overload current limiting method for a voltage source converter of claim 1, wherein a change of the active instruction and a change of the reactive instruction are independent to each other namely, an active power and a reactive power decrease at the same time according to the change method; or a power control station does not change a reactive instruction while changes an active instruction, and a reactive instruction of a direct-current (DC) voltage control station is reduced according to the change method.

3. The overload current limiting method for a voltage source converter of claim 1, wherein if an active power control station receives a water-cooling overload current limiting instruction, the active power control station changes instructions according to the change method of the active and reactive instructions;

if a DC voltage control station receives the water-cooling overload current limiting instruction, the DC voltage control station sends an instruction for requesting to reduce an active power to a power control station through an inter-station communication, and meanwhile a reactive instruction of the DC voltage control station is changed; and after receiving the instruction for requesting to reduce active power from the DC voltage control station, the active power control station changes an active instruction according to the change method, but does not change the reactive instruction.

4. The overload current limiting method for a voltage source converter of claim 1, wherein after a water-cooling overload power limiting instruction received by the upper-layer control host is cancelled, current values of an active power and a reactive power remain unchanged, a new power change slope and a new power instruction value are manually configured, and the active power or the reactive power increases/decreases to the new power instruction value according to the new power change slope; and when the water-cooling overload power limiting instruction is received again, the active power or the reactive power continues a decrease on the basis of current power values until the active power or the reactive power falls to zero.

5. The overload current limiting method for a voltage source converter of claim 1, wherein in a bipolar topology structure, a first pole, when being limited due to overload, individually changes the active power and reactive power of the first pole, and active and reactive power of a second pole are adjusted according to operation requirements, wherein the active power of the second pole is changed in magnitude in concert with the active power of a power-limited pole, or based on a principle that a total active power remains unchanged, the active power of the second pole is obtained by subtracting an actually measured active power value of the power-limited pole from a total active instruction; based on the principle that a total reactive power remains unchanged, the reactive power instruction is obtained by subtracting an actually measured reactive power value of the power-limited pole from a total reactive instruction to be used as a reactive instruction for the first pole.

6. The overload current limiting method for a voltage source converter of claim 5, wherein, when the overload current limiting method is applied in a bipolar topology structure, if the bipolar topology structure operates in a metal return line mode, when the first pole individually changes the active power and reactive power of the first pole since the first pole is limited due to overload, the following method is used for the second pole to keep the total active and reactive power unchanged the method comprising:

switching the first pole limited due to overload to a monopolar power control mode, and the first pole individually changing the active power and reactive instructions of the first pole according to the change method;

keeping a control mode of the second pole unchanged by the second pole;

acquiring an actually measured active power value and an actually measured reactive power value of the first pole limited due to overload through communication;

obtaining the active and reactive power by subtracting the active and reactive power values of the first pole from the total active and reactive instructions respectively; and using the obtained active and reactive power as the active and reactive instructions of the second pole that is not limited.

7. The overload current limiting method for a voltage source converter of claim 5, wherein, when the overload current limiting method is applied in a bipolar topology structure, if the bipolar topology structure operates in a ground return line mode, when the first pole individually changes the active power and reactive power of the first pole since the first pole is limited due to overload, the second pole tracks the first pole and receives an actually measured active power value of the first pole through an inter-pole communication, and a power instruction of the second pole that is not limited equals to an actually measured power of the first pole, such that a current of a ground return line remains zero all the time; and the reactive power instruction is obtained by subtracting an actually measured reactive power value of the first pole from the total reactive instruction to be used as a reactive instruction of the second pole, so that the total reactive power remains unchanged.

* * * * *